US009481944B2

(12) United States Patent
Arena et al.

(10) Patent No.: US 9,481,944 B2
(45) Date of Patent: Nov. 1, 2016

(54) GAS INJECTORS INCLUDING A FUNNEL- OR WEDGE-SHAPED CHANNEL FOR CHEMICAL VAPOR DEPOSITION (CVD) SYSTEMS AND CVD SYSTEMS WITH THE SAME

(71) Applicant: SOITEC, Bernin (FR)

(72) Inventors: Chantal Arena, Mesa, AZ (US); Ronald Thomas Bertram, Jr., Mesa, AZ (US); Ed Lindow, Scottsdale, AZ (US); Christiaan Werkhoven, Gilbert, AZ (US)

(73) Assignee: Soitec, Bernin (FR)

( * ) Notice: Subject to any disclaimer, the term of this patent is extended or adjusted under 35 U.S.C. 154(b) by 413 days.

(21) Appl. No.: 13/828,585

(22) Filed: Mar. 14, 2013

(65) Prior Publication Data
US 2013/0199441 A1 Aug. 8, 2013

Related U.S. Application Data

(60) Continuation of application No. 13/145,290, filed as application No. PCT/US2010/024374 on Feb. 17, 2010, and a continuation-in-part of application No. 13/680,241, filed on Nov. 19, 2012, which is a division
(Continued)

(51) Int. Cl.
C30B 25/14 (2006.01)
C30B 25/10 (2006.01)
C30B 29/40 (2006.01)

(52) U.S. Cl.
CPC .............. *C30B 25/14* (2013.01); *C30B 25/10* (2013.01); *C30B 29/40* (2013.01)

(58) Field of Classification Search
CPC ..... C30B 25/00; C30B 25/02; C30B 25/025; C30B 25/10; C30B 25/12; C30B 25/14; C30B 25/16; C30B 25/165; Y10T 117/00; Y10T 117/10; C23C 16/00; C23C 16/30; C23C 16/301; C23C 16/303; C23C 16/44; C23C 16/455; C23C 16/45502; C23C 16/45504; C23C 16/45514; C23C 16/45517; C23C 16/45561; C23C 16/45563; C23C 16/45582; C23C 16/45587; C23C 16/45591
USPC ....... 117/84, 88, 98–99, 102, 104, 107, 200, 117/937, 952
See application file for complete search history.

(56) References Cited

U.S. PATENT DOCUMENTS 3,075,494 A 1/1963 Toulmin
3,146,137 A 8/1964 Williams
(Continued)

FOREIGN PATENT DOCUMENTS

CN JP2004241412 A 8/2004
CN 101023314 A 8/2007
(Continued)

OTHER PUBLICATIONS

Ambacher, O., "Review Article: Growth and Applications of Group III-Nitrides," Journal of Physics D: Applied Physics 31 (1998) pp. 2653-2710.
(Continued)

*Primary Examiner* — Kenneth A Bratland, Jr.
(74) *Attorney, Agent, or Firm* — TraskBritt

(57) ABSTRACT

The present invention provides improved gas injectors for use with CVD (chemical vapor deposition) systems that thermalize gases prior to injection into a CVD chamber. The provided injectors are configured to increase gas flow times through heated zones and include gas-conducting conduits that lengthen gas residency times in the heated zones. The provided injectors also have outlet ports sized, shaped, and arranged to inject gases in selected flow patterns. The invention also provides CVD systems using the provided thermalizing gas injectors. The present invention has particular application to high-volume manufacturing of GaN substrates.

9 Claims, 5 Drawing Sheets

Related U.S. Application Data of application No. 13/288,396, filed on Nov. 3, 2011, now Pat. No. 8,323,407, which is a continuation of application No. 12/305,534, filed as application No. PCT/US2007/084845 on Nov. 15, 2007, now Pat. No. 8,197,597.

(60) Provisional application No. 61/157,112, filed on Mar. 3, 2009, provisional application No. 60/866,923, filed on Nov. 22, 2006, provisional application No. 60/942,832, filed on Jun. 8, 2007.

(56) References Cited

U.S. PATENT DOCUMENTS

| | | |
|---|---|---|
| 3,476,152 A | 11/1969 | Locke |
| 3,699,666 A | 10/1972 | Calvert et al. |
| 3,724,490 A | 4/1973 | Kramer |
| 4,033,550 A | 7/1977 | Wheatley et al. |
| 4,264,406 A | 4/1981 | Hackskaylo |
| 4,311,545 A | 1/1982 | Bugl et al. |
| 4,362,560 A | 12/1982 | Abrjutin et al. |
| 4,498,953 A | 2/1985 | Cook et al. |
| 4,519,999 A | 5/1985 | Coleman et al. |
| 4,545,512 A | 10/1985 | Shapland et al. |
| 4,669,821 A | 6/1987 | Blair et al. |
| 4,716,130 A | 12/1987 | Johnston, Jr. et al. |
| 4,761,269 A * | 8/1988 | Conger ............ C23C 16/45561 118/679 |
| 4,792,467 A | 12/1988 | Melas et al. |
| 4,798,701 A | 1/1989 | David |
| 4,802,441 A * | 2/1989 | Waugh .................. C21D 1/84 118/666 |
| 4,828,224 A | 5/1989 | Crabb et al. |
| 4,839,145 A | 6/1989 | Gale et al. |
| 4,844,006 A | 7/1989 | Page, Jr. et al. |
| 4,881,719 A | 11/1989 | Bowman |
| 4,911,102 A | 3/1990 | Manabe et al. |
| 4,991,540 A | 2/1991 | Jurgensen et al. |
| 4,993,361 A | 2/1991 | Unvala |
| 5,035,767 A | 7/1991 | Nishizawa |
| 5,047,565 A | 9/1991 | Jones et al. |
| 5,077,875 A | 1/1992 | Hoke et al. |
| 5,080,549 A | 1/1992 | Goodwin et al. |
| 5,136,978 A | 8/1992 | Ahern et al. |
| 5,151,395 A | 9/1992 | Tom |
| 5,202,283 A | 4/1993 | Younger et al. |
| 5,204,314 A | 4/1993 | Kirlin et al. |
| 5,209,952 A | 5/1993 | Erdmann et al. |
| 5,221,556 A | 6/1993 | Hawkins et al. |
| 5,248,800 A | 9/1993 | Smit et al. |
| 5,250,148 A | 10/1993 | Nishizawa et al. |
| 5,298,759 A | 3/1994 | Brewer et al. |
| 5,300,185 A | 4/1994 | Hori et al. |
| 5,383,970 A | 1/1995 | Asaba et al. |
| 5,447,569 A | 9/1995 | Hiskes et al. |
| 5,453,494 A | 9/1995 | Kirlin et al. |
| 5,458,086 A | 10/1995 | Smith et al. |
| 5,668,395 A | 9/1997 | Razeghi |
| 5,711,816 A | 1/1998 | Kirlin et al. |
| 5,782,980 A | 7/1998 | Allen et al. |
| 5,820,641 A | 10/1998 | Gu et al. |
| 5,904,958 A | 5/1999 | Dick et al. |
| 5,909,036 A | 6/1999 | Tanaka et al. |
| 5,935,283 A | 8/1999 | Sweeney et al. |
| 5,948,485 A | 9/1999 | Amano et al. |
| 6,066,204 A | 5/2000 | Haven |
| 6,073,366 A | 6/2000 | Aswad |
| 6,080,241 A | 6/2000 | Li et al. |
| 6,093,252 A | 7/2000 | Wengert et al. |
| 6,110,809 A | 8/2000 | Sze et al. |
| 6,126,719 A | 10/2000 | Sturgill et al. |
| 6,137,231 A | 10/2000 | Anders et al. |
| 6,153,010 A | 11/2000 | Kiyoku et al. |
| 6,153,012 A | 11/2000 | Rupp et al. |
| 6,179,913 B1 | 1/2001 | Solomon et al. |
| 6,206,971 B1 | 3/2001 | Umotoy et al. |
| 6,207,844 B1 | 3/2001 | Kouvetakis et al. |
| 6,214,116 B1 | 4/2001 | Shin |
| 6,218,212 B1 | 4/2001 | Saito et al. |
| 6,218,280 B1 | 4/2001 | Krykiouk et al. |
| 6,221,742 B1 | 4/2001 | Park et al. |
| 6,274,854 B1 | 8/2001 | Franklin et al. |
| 6,274,891 B1 | 8/2001 | Tanaka et al. |
| 6,290,774 B1 | 9/2001 | Solomon et al. |
| 6,331,211 B1 | 12/2001 | Xu et al. |
| 6,350,666 B2 | 2/2002 | Kryliouk |
| 6,406,540 B1 | 6/2002 | Harris et al. |
| 6,406,677 B1 | 6/2002 | Carter et al. |
| 6,495,707 B1 | 12/2002 | Leese et al. |
| 6,520,745 B1 | 2/2003 | Yamamoto et al. |
| 6,527,857 B1 | 3/2003 | Pankove |
| 6,620,256 B1 | 9/2003 | Arno et al. |
| 6,632,725 B2 | 10/2003 | Trassoudaine et al. |
| 6,689,252 B1 | 2/2004 | Shamouilian et al. |
| 6,733,591 B2 | 5/2004 | Anderson |
| 6,815,362 B1 | 11/2004 | Wong et al. |
| 6,845,619 B2 | 1/2005 | Olander |
| 6,855,916 B1 | 2/2005 | Matthews et al. |
| 6,867,067 B2 | 3/2005 | Ghyselen et al. |
| 6,867,112 B1 | 3/2005 | Ishibashi et al. |
| 6,893,507 B2 | 5/2005 | Goodman et al. |
| 6,906,351 B2 | 6/2005 | Kryliouk et al. |
| 6,911,083 B2 | 6/2005 | Hara |
| 6,921,062 B2 | 7/2005 | Gregg et al. |
| 6,926,775 B2 | 8/2005 | Carpenter et al. |
| 6,967,355 B2 | 11/2005 | Kryliouk et al. |
| 7,001,791 B2 | 2/2006 | Kryliouk et al. |
| 7,033,858 B2 | 4/2006 | Chai et al. |
| 7,261,118 B2 | 8/2007 | Birtcher et al. |
| 7,396,415 B2 | 7/2008 | Arena et al. |
| 7,621,999 B2 | 11/2009 | Koukitu et al. |
| 7,632,542 B2 | 12/2009 | Adomaitis |
| 8,187,679 B2 | 5/2012 | Dickey et al. |
| 8,268,646 B2 | 9/2012 | Kryliouk et al. |
| 8,388,755 B2 | 3/2013 | Arena et al. |
| 8,741,385 B2 | 6/2014 | Arena et al. |
| 2001/0006845 A1 | 7/2001 | Kryliouk |
| 2001/0008285 A1 | 7/2001 | Tsujimura et al. |
| 2002/0045362 A1 | 4/2002 | Yang et al. |
| 2002/0090816 A1 | 7/2002 | Ashby et al. |
| 2002/0108714 A1 | 8/2002 | Doering et al. |
| 2003/0015137 A1 | 1/2003 | Sakai et al. |
| 2003/0024475 A1 | 2/2003 | Anderson |
| 2003/0042457 A1 | 3/2003 | Yoo |
| 2003/0094446 A1 | 5/2003 | Tay et al. |
| 2003/0136365 A1 | 7/2003 | Komai et al. |
| 2003/0138367 A1 | 7/2003 | Brady et al. |
| 2003/0168001 A1 | 9/2003 | Sneh |
| 2003/0221617 A1 * | 12/2003 | Lim ..................... C23C 16/452 118/715 |
| 2004/0007188 A1 | 1/2004 | Burkhart et al. |
| 2004/0182315 A1 | 9/2004 | Laflamme et al. |
| 2004/0191142 A1 | 9/2004 | Takemura et al. |
| 2004/0194707 A1 | 10/2004 | Takahashi et al. |
| 2004/0201030 A1 | 10/2004 | Kryliouk et al. |
| 2004/0209402 A1 | 10/2004 | Chai et al. |
| 2004/0235268 A1 | 11/2004 | Letertre et al. |
| 2005/0000406 A1 | 1/2005 | Janzen et al. |
| 2005/0032345 A1 | 2/2005 | Kryliouk et al. |
| 2005/0039794 A1 | 2/2005 | Birtcher et al. |
| 2005/0087746 A1 | 4/2005 | Kryliouk et al. |
| 2005/0163928 A1 | 7/2005 | Otsuka et al. |
| 2005/0221021 A1 | 10/2005 | Strang |
| 2005/0221618 A1 | 10/2005 | AmRhein et al. |
| 2005/0242061 A1 | 11/2005 | Fukuda |
| 2005/0258459 A1 | 11/2005 | Hwang et al. |
| 2006/0008941 A1 | 1/2006 | Haskell et al. |
| 2006/0011135 A1 | 1/2006 | Dmitriev et al. |
| 2006/0040475 A1 | 2/2006 | Emerson |
| 2006/0042544 A1 | 3/2006 | Hasebe et al. |
| 2006/0047132 A1 | 3/2006 | Shenai-Khatkhate et al. |
| 2006/0099123 A1 | 5/2006 | Seeley et al. |
| 2006/0115595 A1 | 6/2006 | Shenai-Khatkhate et al. |
| 2006/0121194 A1 | 6/2006 | Aiso |

(56) References Cited

U.S. PATENT DOCUMENTS

| | | |
|---|---|---|
| 2006/0131606 A1 | 6/2006 | Cheng |
| 2006/0169996 A1 | 8/2006 | D'Evelyn et al. |
| 2006/0228473 A1 | 10/2006 | Satoh et al. |
| 2006/0275546 A1 | 12/2006 | Arena et al. |
| 2007/0108466 A1 | 5/2007 | Kryliouk et al. |
| 2007/0151509 A1 | 7/2007 | Park et al. |
| 2007/0257334 A1 | 11/2007 | Leiberger et al. |
| 2008/0018004 A1 | 1/2008 | Steidl et al. |
| 2008/0026162 A1 | 1/2008 | Dickey et al. |
| 2008/0095675 A1 | 4/2008 | Hartung |
| 2008/0149942 A1 | 6/2008 | Yi et al. |
| 2008/0163816 A1 | 7/2008 | Toda et al. |
| 2008/0248200 A1 | 10/2008 | Arena et al. |
| 2009/0178611 A1 | 7/2009 | Arena et al. |
| 2009/0205563 A1 | 8/2009 | Arena et al. |
| 2009/0223441 A1 | 9/2009 | Arena et al. |
| 2009/0223442 A1 | 9/2009 | Arena et al. |
| 2009/0223453 A1 | 9/2009 | Arena et al. |
| 2009/0234420 A1 | 9/2009 | Wahlstrand et al. |
| 2009/0283002 A1 | 11/2009 | Schultze |
| 2009/0283029 A1 | 11/2009 | Arena et al. |
| 2010/0029064 A1 | 2/2010 | Kryliouk et al. |
| 2010/0242835 A1 | 9/2010 | Arena et al. |
| 2010/0258053 A1 | 10/2010 | Arena et al. |
| 2011/0277681 A1 | 11/2011 | Arena et al. |
| 2012/0048182 A1 | 3/2012 | Arena et al. |
| 2012/0083100 A1 | 4/2012 | Bertram, Jr. |
| 2013/0047918 A1 | 2/2013 | Bertram, Jr. et al. |
| 2013/0104802 A1 | 5/2013 | Arena et al. |

FOREIGN PATENT DOCUMENTS

| | | |
|---|---|---|
| EP | 0870852 | 10/1998 |
| EP | 2570523 | 3/2013 |
| JP | 59-188118 | 10/1984 |
| JP | 61-254225 | 11/1986 |
| JP | 63-316425 | 12/1988 |
| JP | 4-132681 | 12/1992 |
| JP | H10182282 A | 7/1998 |
| JP | 11312650 A | 11/1999 |
| JP | 2000-269142 A | 9/2000 |
| JP | 2001-119106 | 4/2001 |
| JP | 2001192300 A | 7/2001 |
| JP | 2002252176 A | 9/2002 |
| JP | 2002-371361 | 12/2002 |
| JP | 2003-335518 A | 11/2003 |
| JP | 2005-097045 A | 4/2005 |
| JP | 2006073578 A | 3/2006 |
| JP | 2006179653 A | 7/2006 |
| JP | 2006290662 A | 10/2006 |
| JP | 2008060536 A | 3/2008 |
| WO | 9966565 A1 | 12/1999 |
| WO | 00/68471 | 11/2000 |
| WO | 2004025716 A1 | 3/2004 |
| WO | 2005020304 A1 | 3/2005 |
| WO | 2008016836 A2 | 2/2008 |
| WO | 2009/082608 | 7/2009 |

OTHER PUBLICATIONS

Denis et al., Mat. Sci. Eng. R50 (2006) 167).
Duke et al., Inorg. Chem. 30 (1991) 4225.
Reed, Michael D., "Growth and Characterization of Free-Standing Gallium Nitride Substrates by the Hydride-Metalorganic Vapor Phase Epitaxy Technique," Doctoral Thesis, Chemical Engineering, University of Florida, 2002, pp. 1-265. Source location: The University of Florida Libraries, http://uf.catalog.fcla.edu/uf.jsp?st+UF028834430&lx=pm&l=O&V=D&pm=1.
Shi, P., "Thermo-Calc® Database Guide (20060831)" Thermo-Calc Software AB., SE-113 64 Stockholm, Sweden (1995-2006) pp. 1-73.
Elijah, "Maximizing Epitaxial Deposit Uniformity," IBM Technical Disclosure Bulletin, 14(2):593-594 (1971).
Lee et al., "Vapor phase epitaxy of GaN using GaCl3/N2 and NH3/N2," Journal of Crystal Growth, 169: 689-696 (1996).
Red'kin et al., "Chemical Vapor Deposition of GaN from Gallium and Ammonium Chloride," Inorganic Materials, 40(10):1049-1053 (2004).
Varadarajan et al., "On the chloride vapor-phase epitaxy growth of GaN and its characterization," Journal of Crystal Growth, 260: 43-49 (2004).
International Search Report and Written Opinion of the International Searching Authority for application No. PCT/US2007/084826, dated Mar. 31, 2008.
International Search Report and Written Opinion of the International Searching Authority for application No. PCT/US2007/084845, dated May 22, 2008.
International Search Report and Written Opinion of the International Searching Authority for application No. PCT/US2007/070721, dated Feb. 1, 2008.
International Search Report and Written Opinion of the International Searching Authority for application No. PCT/US2010/024374, dated Jun. 29, 2010.
U.S. Appl. No. 13/145,290, filed Jul. 19, 2011.
U.S. Appl. No. 12/894,724, filed Sep. 30, 2010.
U.S. Appl. No. 61/526,143, filed Aug. 22, 2011.
Non-Final Office Action mailed Aug. 9, 2011, U.S. Appl. No. 12/305,394.
Non-Final Office Action mailed Oct. 24, 2011, U.S. Appl. No. 12/305,394.
Non-Final Office Action mailed Oct. 7, 2011, U.S. Appl. No. 12/305,434.
Non-Final Office Action mailed Aug. 4, 2011, U.S. Appl. No. 12/305,495.
Final Office Action mailed Oct. 27, 2011, U.S. Appl. No. 12/305,495.
Non-Final Office Action mailed Oct. 6, 2011, U.S. Appl. No. 12/305,534.
Final Office Action mailed Jan. 31, 2012, U.S. Appl. No. 12/305,534.
Advisory Action mailed Feb. 14, 2012, U.S. Appl. No. 12/305,534.
Non-Final Office Action mailed Sep. 26, 2011, U.S. Appl. No. 12/305,553.
Final Office Action mailed Nov. 22, 2011, U.S. Appl. No. 12/305,553.
Advisory Action mailed Dec. 30, 2011, U.S. Appl. No. 12/305,553.
Non-Final Office Action mailed Oct. 28, 2011, U.S. Appl. No. 12/305,574.
Final Office Action mailed Dec. 8, 2011, U.S. Appl. No. 12/305,574.
International Search Report and Written Opinion of the International Searching Authority mailed Apr. 9, 2008, Appl. No. PCT/US07/84820.
International Search Report and Written opinion of the International Searching Authority mailed Oct. 31, 2008, Appl. No. PCT/US07/84930.
International Search Report and Written Opinion of the International Searching Authority mailed Oct. 3, 2008, Appl. No. PCT/US07/84839.
International Search Report and Written Opinion of the International Searching Authority mailed Mar. 13, 2008, Appl. No. PCT/US07/84857.
International Search Report and Written Opinion of the International Searching Authority mailed May 7, 2008, Appl. No. PCT/US07/84935.
International Search Report and Written Opinion of the International Searching Authority mailed Aug. 27, 2009, Appl. No. PCT/US2008/085707.
Supplementary European Search Report dated Jun. 17, 2010, Appl. No. EP 07873617.
Supplementary European Search Report dated Jun. 1, 2010, Appl. No. EP 07874518.
Supplementary European Search Report dated Jun. 17, 2010, Appl. No. EP 07845102.

(56) References Cited

OTHER PUBLICATIONS

Written Opinion mailed Oct. 19, 2009, Appl. No. SG 200901698-1.
Written opinion mailed Nov. 12, 2009, Appl. No. SG 200901701-3.
Chinese Article: Ni Wen, Wang Yingsheng and Wang Guoqing, Prospect and Construction of Heat Insulating Materials, Dec. 31, 2002, University of Science and Technology Bejing, China Academic Journal Electronic Publishing House—English Translation of pertinent parts of Chinese language found in English Translation of Office Action—CN Application No. 201080005892.4.
Timoshkin et al., "A Theoretical Approach to the Single-Source Precursor Concept: Quantum Chemical Modeling of Gas Phase Reactions," Journal of Crystal Growth 222 (2001) pp. 170-182.
Matsumoto et al., "Growth Mechanism of Atmospheric Pressure MOVPE of GaN and Its Alloys: Gas Phase Chemistry and Its Impact on Reactor Design," Journal of Crystal Growth 272 (2004) pp. 360-369.
Watwe et al., Gas-Phase Chemistry of Metalorganic and Nitrogen-Bearing Compounds, Journal of Crystal Growth 221 (2000) pp. 751-757.
Okamoto, Y., "Theoretical Study on the Precursors of Group-III Nitrides," Journal of Crystal Growth 191 (1998) pp. 405-412.
O'Brien P. Pickett NL, et al. (2002), "Developments in CVD Delivery Systems, A Chemist's Perspective on the Chemical and Physical Interactions between Precursors" Chemical Vapor Deposition 8(6), pp. 237-249.
S.Y. Karpov. "Advances in Modeling of MOVPE Processes," Journal of Crystal Growth 248 (2003) pp. 1-7.
G.B. Stringfellow, Chapter 4 "Source Molecules" in "Organometallic Vapor-Phase Epitaxy (Second Edition)," Academic Press (1999) pp. 151-209.
International Preliminary Report for Patentability for International Application No. PCT/US2007/84845 dated Jan. 16, 2012, 7 pages.
International Preliminary Report for Patentability for International Application No. PCT/US2010/24374 dated Sep. 6, 2011, 7 pages.

\* cited by examiner

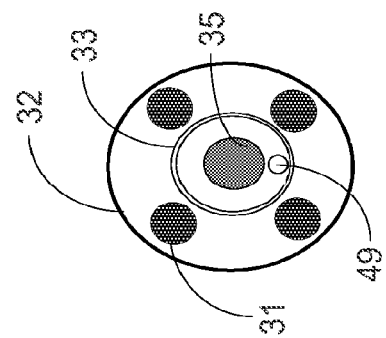
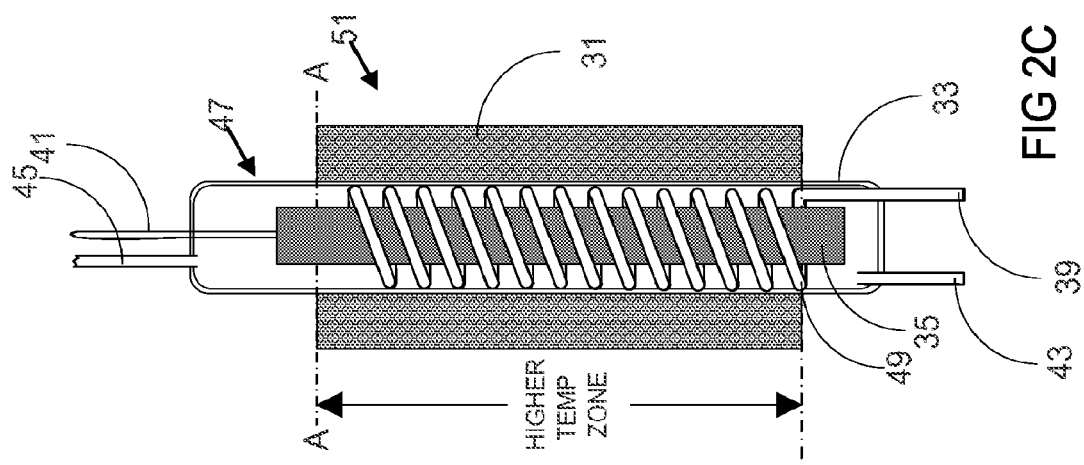
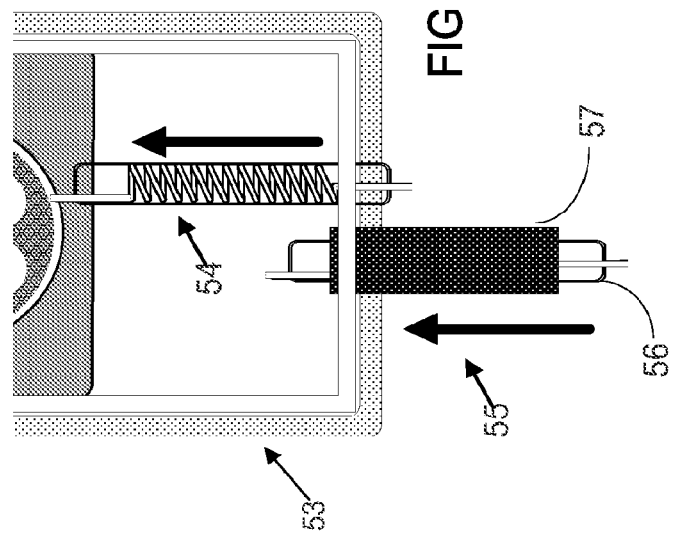

GAS INJECTORS INCLUDING A FUNNEL- OR WEDGE-SHAPED CHANNEL FOR CHEMICAL VAPOR DEPOSITION (CVD) SYSTEMS AND CVD SYSTEMS WITH THE SAME

CROSS-REFERENCE TO RELATED APPLICATIONS

This application is a continuation of U.S. patent application Ser. No. 13/145,290, filed Jul. 19, 2011, which application is a national phase entry under 35 U.S.C. §371 of International Patent Application PCT/US2010/024374, filed Feb. 17, 2010, designating the United States of America and published in English as International Patent Publication WO/2010/101715 on Sep. 10, 2010, which claims the benefit under Article 8 of the Patent Cooperation Treaty to U.S. Provisional Patent Application Ser. No. 61/157,112, filed Mar. 3, 2009. This application is also a continuation-in-part of U.S. patent application Ser. No. 13/680,241, filed Nov. 19, 2012, which application is a divisional of U.S. patent application Ser. No. 13/288,396, filed Nov. 3, 2011, now U.S. Pat. No. 8,323,407, issued Dec. 4, 2012, which application is a continuation of U.S. patent application Ser. No. 12/305,534, filed Dec. 18, 2008, now U.S. Pat. No. 8,197,597, issued Jun. 12, 2012, which is a national phase entry under 35 U.S.C. §371 of International Patent Application PCT/US2007/084845, filed Nov. 15, 2007, which claimed priority to U.S. Provisional Patent Application Ser. No. 60/866,923, filed Nov. 22, 2006, and to U.S. Provisional Patent Application Ser. No. 60/942,832, filed Jun. 8, 2007.

FIELD OF THE INVENTION

The present invention relates to semiconductor processing equipment and, in particular, provides gas injectors that inject thermalized gases into CVD chambers, and injectors that inject thermalized gases in pre-determined flow patterns. The present invention also provides CVD systems using the provided gas injectors. The invention has particular application to high-volume manufacturing of GaN substrates.

BACKGROUND OF THE INVENTION

Inadequate thermalization (heating) of precursor gases prior to their injection into a CVD chamber and their premature mixing within the chamber can lead to a number of problems that can be specific to each particular CVD process being performed. Consider, as an example, the hydride-vapor-phase epitaxial (HVPE) growth of GaN using $GaCl_3$, and $NH_3$ as the precursor gases, where problems caused by inadequate thermalization and premature mixing include the following.

First, injection of inadequately thermalized precursors can lead to unwanted deposition on surfaces other than the growth substrate. Over time, this unwanted material can lead to increased particulate levels in the reactor sufficient to decrease wafer quality, and also to coating of chamber walls sufficient to interfere with efficient radiant heating. Such undesirable deposition occurs since $GaCl_3$ condenses from the vapor phase at relatively low temperatures, e.g., less than 500° C., and, therefore, areas of the reactor that are not maintained above vaporization temperatures are likely to become coated. It is, therefore, desirable that $GaCl_3$ be thermalized to temperatures of at least about 500° C. prior to injection into the reaction chamber. In fact, it is desirable to thermalize the $GaCl_3$ precursor to temperatures of at least 730° C. prior to injection into the reaction chamber.

Further in connection with HVPE processes, injection of inadequately thermalized precursors can lead to unwanted side reactions that limit actual GaN deposition. Because gas temperatures less than about 930° C. can lead to formation of undesirable adducts, e.g., $GaCl_3:NH_3$, it is also desirable that both $GaCl_3$ and $NH_3$ be thermalized to a temperature of at least about 930° C. prior to injection into the reaction chamber. Moreover, to further limit formation of such undesirable adducts, it is preferable to keep separate the group III and group V precursor flows until they are in the direct vicinity of the growth susceptor. Premature mixing of the precursor gases can result in unwanted reaction by-products and the production of particulates within the reactor.

Finally, in connection with HVPE processes, it is desirable to thermalize the group V precursor (commonly $NH_3$) prior to injection into the reaction chamber. Inadequately thermalized group V precursor, upon mixing with a thermalized group III precursor, can cool the group III to a sufficient extent to lead to the above undesirable effects. However, thermalization of the group V ammonia precursor should not be carried out in an environment containing metals, e.g., in metallic gas lines, metallic reactor components, etc., as is often done. At elevated temperatures, metals can catalyze cracking of reactive $NH_3$ to $N_2$ (and $H_2$), which is not reactive with GaCl, to produce GaN.

The above problems resulting from inadequate thermalization and premature mixing result in an inefficient reaction of the precursor gases to form the GaN product at the substrate. Precursor reactants are lost due to particle/complex formation, deposition on unwanted surfaces, and so forth. Improving thermalization and delivery of precursor gases can be expected to result in a more efficient utilization of precursor gases with the associated benefits in reduced costs and improvements in material growth rate.

Problems of precursor thermalization and separation for HVPE III-nitride deposition is addressed in U.S. Pat. Nos. 6,179,913 and 6,733,591. However, this prior art is concerned with conventional equipment where GaCl is formed in situ by reacting HCl gas with liquid gallium and is not applicable to equipment that directly injects gaseous $GaCl_3$. U.S. Provisional patent application Ser. No. 61/015,524 is concerned with thermalization and spatial separation of precursors utilizing external $GaCl_3$ and $NH_3$ sources, however, this prior art application utilizes a single injection fixture for injection of both the group III and group V precursors.

SUMMARY OF THE INVENTION

To overcome the limitations of the prior art, the present invention provides a number of elements, including thermalizing gas injectors, for improving precursor thermalization and mixing, features that have been found to be advantageous.

In particular, provided herewith is a method for epitaxial deposition of a monocrystalline Group III-V semiconductor material by reacting an amount of a gaseous Group III precursor of gallium trichloride as one reactant with an amount of a gaseous Group V component as another reactant in a reaction chamber under conditions sufficient to deposit the semiconductor material on one or more substrates. This method comprises heating the Group III precursor in a heating zone external to the reaction chamber to a temperature sufficient to decompose dimers therein, as well as to prevent dimer formation of the precursor prior to contacting the one or more substrate(s); and passing the Group III precursor through a funnel- or wedge-shaped channel that increases in cross-section in the direction of gas flow in order to provide an expanded laminar stream of heated Group III precursor gas along a wall of the reaction chamber to the one or more substrate(s), with the stream being sufficiently expanded to flow above each of the one or more substrate(s) to thereby deposit the semiconductor material on the substrate(s). The method includes passing a laminar gas stream of heated Group V component into the reaction chamber in a flow path above the Group III precursor gas stream and at a velocity such that the Group V component and Group III precursor react above the one or more substrate(s) and deposit the semiconductor material thereon. Typically, the gaseous Group V component is a nitrogen-containing component and is provided in a substantially greater amount than that of the gaseous Group III precursor so that a monocrystalline gallium nitride is provided.

The Group III precursor may be heated by passing it through a heating chamber that includes silicon carbide material therein and by heating the silicon carbide material with one or more heat-producing elements located externally of the heating chamber. The heating chamber is generally configured to provide a longer gas flow path and an increased gas flow time path length that allows the Group III precursor gas to contact the silicon material directly or indirectly to heat the precursor gas to a temperature of at least 700° C. to 800° C.

The Group III precursor gas flow may be expanded in the heating chamber, with the heated and expanded Group III precursor gas stream passed into the reaction chamber by directing the gas from the heating chamber in a first direction through a slot opening and then changing the direction of gas flow in the reaction chamber to a second direction along the reaction chamber wall and toward the substrate(s). Alternatively, the heated Group III precursor gas stream can be passed into the reaction chamber through a relatively narrower apex gas inlet port and a relatively broader base that expands within the reaction chamber to provide the expanded laminar flow of the precursor gas stream toward the substrate(s).

Preferably, the reaction chamber includes a susceptor for supporting the substrate(s) and the method further includes rotating the susceptor while the gases of Group III precursors and Group V component flow toward the susceptor to facilitate complete contact of the substrate(s) while the gases react for growth of the semiconductor material on the substrate(s).

Another advantageous feature of the method includes controlling the external temperature of the reaction chamber by passing cooling gas through an enclosure around the reaction chamber with the cooling gas flowing through the enclosure in the same direction as the heated gas streams to remove heat and prevent deposition of semiconductor material on reaction chamber walls. Heating sources for heating the reaction chamber can be conveniently provided in the cooling chamber.

Another embodiment is an apparatus for epitaxial deposition of a monocrystalline Group III-V semiconductor material. This apparatus includes a reaction chamber that receives gas streams of a gaseous Group III precursor of gallium trichloride as one reactant and a gaseous Group V component as another reactant; one of more substrates(s) positioned in the reaction chamber to receive a deposit of semiconductor material from reaction of the Group III precursor and Group V component; a heating chamber external of the reaction chamber for heating the gaseous Group III precursor to a temperature sufficient to decompose dimers therein, as well as to prevent dimer formation of the precursor prior to contacting the one or more substrate(s); and means operatively associated with the heating and reaction chambers for passing the Group III precursor through a funnel- or wedge-shaped channel that increases in cross-section in the direction of gas flow in order to provide an expanded laminar stream of heated Group III precursor gas along a wall of the reaction chamber to the one or more substrate(s), with the stream being sufficiently expanded to flow above each of the one or more substrate(s) to thereby deposit the semiconductor material on the substrate(s).

The apparatus further comprises a gate valve for heating and passing a laminar gas stream of heated Group V component into the reaction chamber in a flow path above the Group III precursor gas stream and at a velocity such that the Group V component and Group III precursor react above the one or more substrate(s) and deposit the semiconductor material thereon. The heating chamber generally comprises heat-producing elements located externally of the heating chamber and silicon carbide material in the chamber, with the Group III precursor gas heated in a gas-conducting conduit comprising a spiral tube that surrounds silicon carbide material. The funnel- or wedge-shaped channel may be located on the wall of the reaction chamber upstream of the substrate(s) with the channel including a small cross-section expanding to a larger cross-section that is at least as wide as the width of the one or more substrate(s). Alternatively, the heating chamber is configured for expanding the Group III precursor gas to provide a longer gas flow path and an increased gas flow time path length that allows the Group III precursor gas to contact the silicon material directly or indirectly to heat the precursor gas to a temperature of at least 700° C. to 800° C. For this, the heating chamber is configured to direct the heated precursor gas in a first direction through a slot opening and the reaction chamber includes a wall member along the slot that changes the direction of precursor gas flow to a second direction along the reaction chamber wall and toward the substrate(s).

The reaction chamber can also include a susceptor for supporting the substrate(s) and means for rotating the susceptor, while the gases of Group III precursors and Group V component flow toward the susceptor to facilitate complete contact of the substrate(s), while the gases react for growth of the semiconductor material on the substrate(s). It is also advantageous to include an enclosure surrounding the reaction chamber for controlling temperature thereof, and one or more fans for passing cooling gas through the enclosure with the cooling gas flowing through the enclosure in the same direction as the heated gas streams to remove heat and prevent deposition of semiconductor material on reaction chamber walls. The apparatus further comprises heating sources for heating the reactor located in the cooling chamber.

The preferred embodiments and particular examples described herein should be seen as examples of the scope of the invention, but not as limiting the present invention. The scope of the present invention should be determined with reference to the claims, which are to be interpreted as covering modifications, equivalents, alternatives, and the like, apparent to artisans of ordinary skill in the art. For clarity and conciseness, not all features of the embodiments are described here; it will be understood that features not described are routine in the art and could be added by an artisan of ordinary skill.

Headings are used herein for clarity only and without any intended limitation. A number of references are cited herein, the entire disclosures of which are incorporated herein, in their entirety, by reference for all purposes. Further, none of the cited references, regardless of how characterized, is admitted as prior to the invention of the subject matter claimed herein.

BRIEF DESCRIPTION OF THE DRAWINGS

The present invention may be understood more fully by reference to the following detailed descriptions of the preferred embodiments and illustrative examples of specific embodiments of the present invention, and the appended figures in which:

FIGS. 2A-2D schematically illustrate a first embodiment of the thermalizing gas injectors of this invention;

DETAILED DESCRIPTION OF THE PREFERRED EMBODIMENTS

Figure 2A:
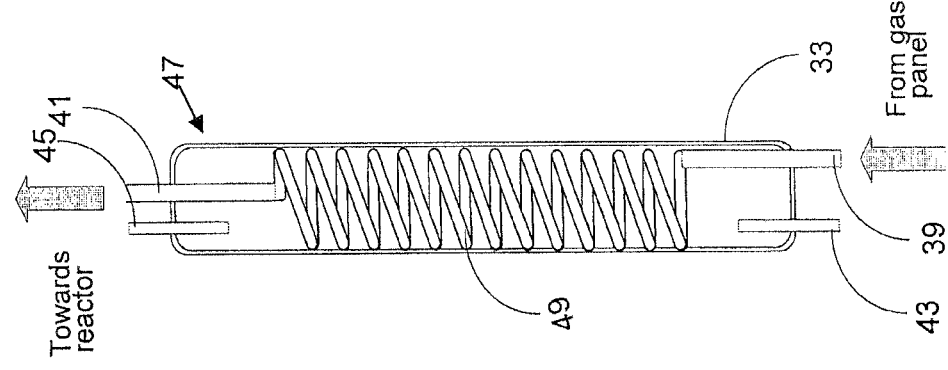

The thermalizing gas injectors of this invention provide better precursor thermalization by conducting gases through conduit structures that are sized and configured to increase the residence times of conducted gases, and at the same time, by providing heating means that passively or actively heat the conduit structures. Generally, since residence time is the ratio of gas flow length to gas flow velocity, different embodiments of this invention can provide conduit structures that are configured and sized to either increase or decrease, or to leave unchanged, the gas flow path lengths and gas flow velocities as long as their ratio, the residence time, is increased. In preferred embodiments, only one of these parameters is significantly changed while the other is left substantially unchanged. In particular, certain preferred embodiments have conduit structures configured and sized to have a longer path length with a cross-section sufficient to preserve flow velocities, or to have increased cross-section (and, correspondingly, decreased gas velocities) with a substantially unchanged path length.

Relative terms, e.g., "increased," "decreased," and "unchanged," as applied to a conduit of the invention, are to be understood as in comparison to a conduit that would be typically used to convey the same selected quantities of gases between the same gas sources and gas sinks. Typical conduits are usually as short as reasonably allowed in view of obstructions between source and sink, design criteria, safety, and the like. However, embodiments of this invention have conduits that are longer than such reasonable minimum lengths. Also, typical conduits usually have a cross-section as small as reasonably allowed in view of the required mass flow, gas properties, and so forth. Similarly, embodiments of this invention include conduits with cross-sections that are larger than such reasonable minimum cross-sections.

The invention includes specific preferred thermalizing injectors, each satisfying a specific gas injection requirement (and suitable for a specific CVD chamber). For example, for injecting gases at relatively higher flow rates, suitable embodiments can have wider and/or shorter gas-conducting conduits, while conversely, for injecting gases at relatively lower flow rates, suitable embodiments can have narrower and/or longer gas-conducting conduits. Also, for injecting gas streams with selected cross-sectional profiles, suitable embodiments can have exit ports configured similarly to the selected cross-sectional profile. Gas streams with smaller cross-sectional profiles can be injected though nozzle-like exit ports, while gas streams with larger cross-sectional profiles, e.g., profiles that extend across a significant portion of a CVD chamber, can be injected through a horizontally wide but vertically narrow exit port. Also, for injecting gases that can benefit from increased thermalization, suitable embodiments can have gas conduits with even longer residence times, e.g., conduits that are longer, or that have larger cross-sections, or both. Further, conduit structures and gas flow paths can have different portions with different combinations of cross-sectional size and length, or with smoothly varying cross-sectional sizes, or the like, as long as the net effect is increased residence times. However, it should be understood that such specific embodiments can be useful with a wide variety of gases having a wide variety of other and different injection requirements.

Conduit structures and components, e.g., gas-conducting portions, are preferably fabricated from materials capable of withstanding high-temperature corrosive environments, but also of being formed into required shapes at lower cost. A preferred material comprises quartz.

Heating means for conduit structures can be active or passive. "Active heating" means include heat-producing elements, e.g., resistive elements, radiant elements, microwave elements, and so forth, specifically selected and positioned, usually adjacent, so as to transfer heat directly to the conduit structures. "Passively heating" refers to conduits located at least partly in a heated environment, e.g., CVD chamber, from which heat can be absorbed. Heated environments are often heated by active heating means, and conduit structures are preferably positioned in such environments with respect to such active heating means so that heat transfer is optimized in the circumstances. For example, in case of a CVD chamber heated by radiant elements, a conduit structure can be positioned near, or with an unobstructed path to, the radiant elements, but so that susceptors, robot anus, and the like, are not interfered with. Passive heating can also be optimized by including structures that absorb heat from the environment so as to transfer it to the conduit structures. Additionally, passive heat transfer means can include black body structures positioned to absorb and re-radiate radiant energy to the conduit structure.

Black body structures are preferably fabricated from materials with emissivity values close to unity (at least for infrared radiation) and that are also capable of withstanding high-temperature corrosive environments. Suitable materials include AlN, SiC and $B_4C$ (having emissivity values of 0.98, 0.92, 0.92, respectively).

Preferred embodiments of the invention provide injectors for injecting gases into CVD (chemical vapor deposition) chambers. The injectors include one or more gas-conducting conduits for conveying gases along a flow path through the conduit from a gas inlet port to one or more gas outlet ports; the conduits have one or more segments configured and/or sized to increase the times required for gases to flow through the conduit in comparison to the times required, were the selected segment not so configured and sized. Preferably, at least part of the gas-conducting conduits is of quartz. The preferred embodiments of the invention also provide heating means for heating the conduits including a heated CVD chamber, or one or more heat-producing elements, or similar. Preferred uses of the injectors of the invention include injecting precursor gases and/or purge gases for conducting CVD processes; for example, the precursor gases can include III-metal precursors or nitrogen precursors for growth of a III-nitride semiconductor in the CVD chamber.

In preferred embodiments, the provided injectors have gas-conducting conduits that include at least one segment configured to have a longer gas flow path, so that gas flow times are increased without decreases in gas flow velocities. The longer segments can be configured to have a spiral-like shape that lengthens the gas flow path between entry and exit. The conduits can also include an outer housing that encloses part of all or the spiral-shaped segment. The outer housing can be provided with external clamp-shell heaters arranged adjacent to the outer housing, or with interior black body elements external to the spiral-shaped segment that enhances heat transfer from the exterior to the gas-conducting conduit. The outer housing can also have a gas inlet port and a gas outlet port that can be configured and sized so that gases can flow through the inner housing from the inlet port to the outlet port.

In preferred embodiments, the provided injectors have gas-conducting conduits that include at least one segment configured to have a gas flow path with a larger cross-sectional size so that gas flow times are increased with decreases in gas flow velocities. The larger segments can be of larger but substantially constant cross-section and can be configured and sized to be arranged within a CVD chamber where they can be heated by the CVD chamber (when heated). The larger, interior segments of such injectors can be further arranged along a longitudinal interior wall of the chamber; the larger, lateral segments of such injectors can have a plurality of outlet ports arranged to direct gas flows from the lateral wall toward the center of the chamber.

In preferred embodiments, the provided injectors with conduits having a larger cross-sectional size can be configured so that the cross-sectional sizes grow larger from an apex portion where gases enter the conduit toward a base portion where gases leave the conduit and enter the CVD chamber. The larger segments can be configured to have a relatively narrower apex with one or more gas inlet ports and a relatively broader base with one or more gas outlet ports that open into the CVD chamber. The larger segments can be configured as a wedge-shaped channel within a planar structure. The planar structure can be configured to be shorter in a vertical direction and larger in a transverse direction. The planar structure can be configured and sized to be arranged interior to the CVD chamber where it can be heated by the CVD chamber (when heated). In particular, the planar structure can be positioned along an upstream transverse chamber wall so as to direct exiting gas in a downstream direction. The planar structure can also include one or more second gas-conducting conduits that do not intersect the wedge-shaped channel. The second gas-conducting conduits can have substantially constant cross-sectional sizes, and can have one or more second outlet ports that open into the CVD chamber laterally to the outlet port of the wedge-shaped channel.

The invention also provides CVD systems with one or more of the provided gas injectors. Such a system can include one or more first injectors of the embodiments having a conduit configured and sized to grow larger from an apex portion toward a base portion. This injector can have an outlet port adjacent to a susceptor having a growth surface within the CVD chamber and can be oriented to direct first gases in a longitudinal flow that extends transversely across a portion or all of the susceptor growth surface. This injector can include second conduits with two or more second outlet ports oriented to direct second gases in longitudinal flows lateral to the first gas flow.

Such a system can also include one or more second injectors of the embodiments having a conduit configured into a spiral-like shape. This injector can have outlet ports positioned and arranged to direct gases into the inlet ports of the first injectors.

Such a system can also include one or more third injectors of the embodiments having a segment configured with a larger cross-sectional size. This injector can be configured and sized so that the larger segment can be arranged interior to a CVD chamber wherein it can be heated by the CVD chamber (when heated). The larger interior segment can be arranged along a longitudinal interior wall of the chamber. This larger segment can have a plurality of outlet ports positioned and oriented to direct multiple gas flows from the lateral wall toward the center of the chamber. Such a system can also include one or more black body plates for enhancing heat transfer from heating elements external to the CVD chamber to the third injectors.

Another embodiment of the invention relates to a method for injecting gases into a CVD (chemical vapor deposition) chamber by conveying gases along a segmented flow path from a gas inlet port to one or more gas outlet ports, with each segment configured or sized to increase gas flow time in comparison to the segments that are not so configured and sized, and heating the one or more segments as the gases are conveyed therethrough. The at least one selected segment provides a gas flow path with a larger cross-sectional size and increased gas flow times at smaller gas flow velocities with the gases flowing therein including a nitrogen precursor for growth of a Group III-nitride semiconductor in the chamber. Also, at least one other segment has a cross-sectional size that grows larger from an apex section toward a base section where the segment opens into the chamber, with the gases flowing therein including a Group III-metal precursor for growth of a Group III-nitride semiconductor in the chamber. The chamber preferably includes therein a susceptor having a growth surface and the gases of Group III-metal and nitrogen precursors are heated and directed toward the susceptor growth surface for growth of a Group III-nitride semiconductor thereon. Advantageously, the gases react at a temperature approximately greater than 930° C. to facilitate growth of the Group III-nitride semiconductor on the susceptor growth surface while minimizing formation of undesirable precursor complexes.

The present invention provides improved gas handling for chemical vapor deposition (CVD) reactors systems, especially CVD systems used for semiconductor processing and, more especially, CVD systems having chambers with generally rectangular cross-sections in which a planar flow of precursor gases crosses a substrate at which deposition or other reactions take place. Exemplary CVD chambers in which the invention can be usefully applied are briefly described before turning to the invention.

Figure 1:
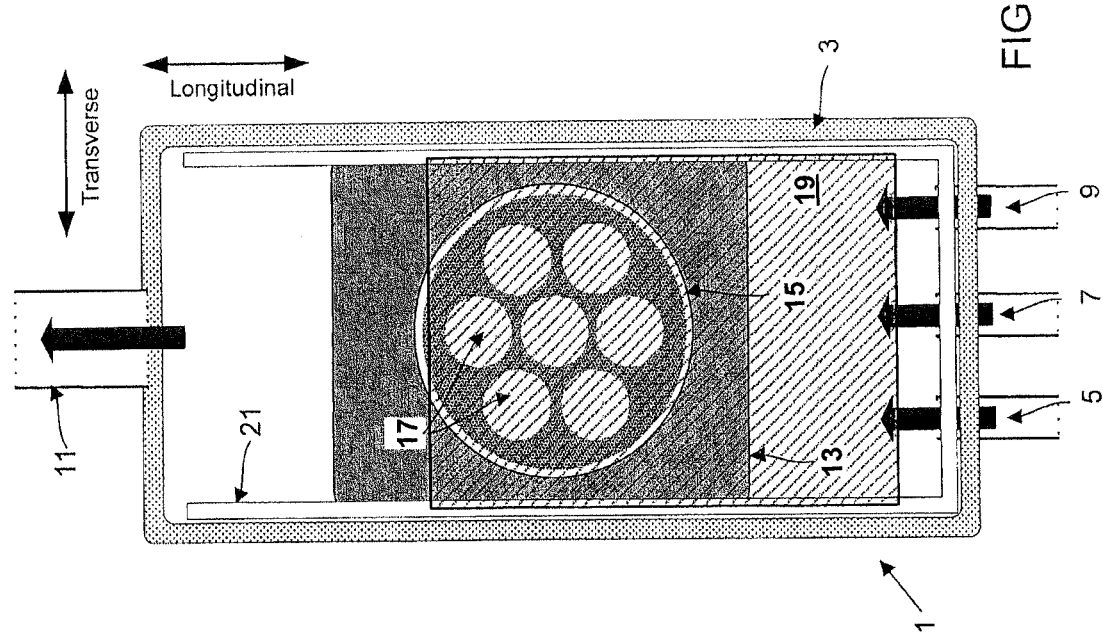
FIG. 1 schematically illustrates an exemplary CVD reactor.

FIG. 1 illustrates in plan view relevant detail of exemplary CVD reactor 1 to which this invention is applicable. FIG. 3A illustrates in cross-sectional view a similar CVD reactor. Common reference numbers identify similar elements in both figures. Exemplary reactor 1 includes reactor chamber 3, which is usually made of quartz so that it can be heated by external, radiant heating lamps. Process gases including precursor gases and purge gases enter chamber 3 at the bottom of the figure through ports (or inlets or injectors) 5 and 9. The inlet ports are commonly designed and arranged to prevent premature mixing of the precursor gases. Here, for example, different precursor gases can enter through spaced-apart ports 5 and 9, while relatively inert purge gases can enter through port 7. The process gases then travel upward in the figure through the chamber (defining the "downstream" direction) and react at centrally located substrates supported by substrates 17 on susceptor 15. The susceptor usually rotates, guided by support ring or plate 13. The process gases exit the chamber through exhaust 11.

Optionally, reactor 1 can include black body plate 19 supported on, e.g., support 21 above susceptor 15 and substrates 17. This black body plate can aid in thermalizing process gases flowing in proximity to the plate by absorbing radiation from radiant heat lamps, and reradiating the absorbed radiation into process gases. See, e.g., U.S. Provisional patent application Ser. No. 61/031,837 filed Feb. 27, 2008 (which is incorporated herein by reference in its entirety for all purposes).

In the following, the terms "longitudinal" and "transverse" are used to refer to the directions within a CVD chamber indicated by the labelled arrows in FIG. 1. Longitudinal directions are also referred to as "upstream" and "downstream"; the longitudinally oriented walls are also referred to as "side" (or "lateral") walls. Transverse directions are also referred to as "across the reactor"; the transversely oriented walls are also referred to as "end" walls.

The invention is described in the following preferred embodiments in the context of this exemplary CVD chamber, the details of which are not further considered. However, the focus is for conciseness only and without limitation, as it will be understood that this exemplary chamber is not limiting, and that the apparatus of the invention is compatible with other CVD chambers.

Preferred Embodiments of Thermalizing Gas Injectors

Preferred embodiments of the thermalizing gas injectors of this invention are now described that achieve increased gas residence times by configuring and sizing conduit structures to have gas flow paths with lengths that are increased beyond those reasonably necessary in the circumstances (in view of the physical layout of the chamber and associated equipment) and that have cross-sections that are at least not substantially less than what is reasonably necessary for the intended gas flow velocities (in view of known principles of gas flow in conduits). Accordingly, the injectors of this embodiment can be useful for gases that enter into the CVD chamber at relatively lower flow rates. Preferably, increased path length can be accommodated by bending and/or folding the flow path into serpentine shape, e.g., a spiral shape.

Since thermalizing gas injectors of this embodiment are useful for injecting better thermalized gases at relatively lower, or at least not increased, flow rates, when used in connection with the growth of Group III-nitride compounds, the injectors of this embodiment are more preferred for use with Group III-metal precursors, which typically enter at relatively lower flow rates than for use with N precursors, which typically enter at relatively higher flow rates. However, the injectors of this embodiment can also be useful for gases that enter into the CVD chamber at relatively lower flow rates.

FIGS. 2A-2D illustrate thermalizing gas injectors of this embodiment. In particular, FIG. 2A illustrates conduit structure 47 with spiral-shaped, gas-conducting conduit 49 with a substantially uniform diameter (cross-section). Gases, e.g., precursor gases, enter into conduit structure 47 through inlet port 39, flow through spiral-shaped, gas-conducting conduit 49, and exit from the conduit structure through outlet 41, e.g., directly into a CVD chamber. Gas-conducting conduit 49 provides a gas path length that is substantially longer than reasonably necessary to conduct gases over the shorter physical distance between inlet port 39 and outlet port 41. Because of the spiral shape of gas-conducting conduit 49, the path length of gas flowing through conduit structure 47 is longer, even substantially longer, than the actual physical distance between the inlet and outlet ports. The spiral-shaped portion illustrated here is not limiting, and the invention should be understood to include other serpentine shapes. Precursor gases can be supplied to conduit structure 47 from external sources at flow rates controlled by an external gas control arrangement ("a gas panel").

Conduit structures of this embodiment preferably include outer housings that enclose and protect at least the serpentine-shaped portions of the gas-conducting conduits (which are expected to be easily damaged). Here, conduit structure 47 includes outer housing 33 enclosing all of gas-conducting conduit 49 other than inlet port 39 and outlet port 41. Outer housings can also serve as additional gas-conducting conduits, e.g., purge gases. Here, outer housing 33 has been provided with purge-gas inlet port 43 and purge-gas outlet port 45 so that a purge gas can flow through the outer housing. Purge gas (or similar gas) flows are advantageous since they can foil regions of overpressure with respect to the CVD chamber interior that can act to limit or prevent back flows of gases from the chamber interior. Back flows of reactive and often corrosive gases from the interior of an operating CVD chamber can cause damage to, or undesirable deposition on, a conduit structure.

Conduit structure 47 can be passively heated, or actively heated, or both passively and actively heated. Conduit structures are passively heated, preferably by being partially or entirely located within a heated CVD chamber (or within another heated environment). FIG. 2B illustrates passively heated conduit structure 54 (similar to that of FIG. 2A) located largely within CVD chamber 53. Passive heat-transfer elements (not illustrated here) can be optionally provided to improve transfer of heat from the chamber interior to the conduit structure. For example, if the CVD chamber is heated by heat lamps, a passive element can include a black body structure located in the vicinity of the gas injector that absorbs radiation from the heat lamps and re-radiates it to the conduit structure.

Conduit structures are preferably actively heated by providing heat-producing elements that are adjacent to at least a portion of the gas-conducting portion, preferably at least part of which is configured for increased gas residence times, and that provide heat directly to the adjacent portion. Active heating elements are preferably located adjacent (or near) and exterior to the conduit structure; they can also be located interior to the conduit structure. Active heating elements include radiation-emitting elements, e.g., heat lamps, inductive heating elements, electrical heating elements, e.g., resistance heating elements, and so forth. Conduit structures can also be both passively and actively heated, for example, when an actively heated conduit structure is located at least partially within a CVD.

FIG. 2B illustrates actively heated gas injector 55 located largely external to CVD chamber 53 (similar to CVD reactor 1 of FIG. 1). Injector 55 includes gas-conducting portion 56 and active heating elements 57. In further embodiments of the invention, actively heated gas injector 55 can be external to CVD chamber 53 and located beneath the reactor with heated precursor input entering into the underside (i.e., into the base) of the CVD chamber.

FIGS. 2C and 2D illustrate essential details of actively heated conduit structure 51. In FIG. 2C (plan view), active heating element 31 comprises a conductive element, e.g., a resistively heated clamp-shell heater, located exterior to and about outer housing 33. In FIG. 2D (cross-sectional view), active heating elements 31 comprise radiant elements, e.g., heat lamps, that are external to outer housing 33 of the conduit structure but are enclosed within shell 32, which can serve to reflect radiation inward to gas-conducting conduit 49. In both figures, gases flowing through spiral-shaped, gas-conducting conduit 49 from inlet port 39 to outlet port 41 are heated by heating element 31 before injection into a CVD chamber. Optionally, purge gases flowing through outer housing 33 from inlet port 43 to outlet port 45 are also heated before injection. It is apparent from these figures that the active heating elements define a higher temperature zone through which gases flow prior to injection.

FIGS. 2C and 2D also illustrate optional element 35 that can be an active or a passive heating element. Preferably, this optional element is a passive element that serves to improve heat transfer from active elements 31 to gas-conducting conduit 49. In the case of conductive heating elements, passive element 35 can be a conductor that re-distributes heat to the inner portion of gas-conducting conduit 49. In the case of radiant heating elements, passive element 35 can be a black body structure, e.g., a rod comprising a black body material that re-radiates heat. In the case of inductive heating elements, passive element 35 can include electrically conductive structures that can absorb inductive energy so as to heat the gas-conducting conduits. With optional element 35, gases in gas-conducting conduit 49 can be heated both directly by the active heating elements and indirectly by passive element 35.

As described, thermalizing gas injectors of this embodiment, in particular, injectors such as injector 51 of FIG. 2C, can be used to inject gaseous Group III-metal precursors into a CVD chamber for the processing of Group III-nitride compounds, in particular, for providing, a gaseous $GaCl_3$ precursor for GaN growth according to an HVPE process. In such an application, outer housing 33 and gas-conducting conduit 49 preferably comprise quartz. Passive element 35 is a solid or tubular black body structure preferably comprising, for example, SiC, $B_4C$, AlN. Active heating element 31 comprises an electric heating jacket, e.g., clamp shell heater, which surrounds quartz outer housing 33 and is capable of heating to temperatures between 500° C. and 1000° C.

In operation, a $GaCl_3$ precursor enters the injector through inlet 39 with an incoming flow rate of usually on the order of several hundred sccm (standard cubic centimeters per minute) but possible up to 20-30 SLM (standard liters per minute) and exits through outlet port 41 at temperatures preferably between 500° C. and 1000° C. An $N_2$ (or alternatively an $N_2$ and $H_2$ gas mixture) purge gas enters through inlet port 43 with an incoming flow rate of approximately 1-5 SLM, maintains an overpressure in at least the interior of the outer housing, and exits through outlet port 45. During its residence in the injector, the purge gas can also be heated.

Further Preferred Embodiments of Thermalizing Gas Injectors

Preferred embodiments of the thermalizing gas injectors of this invention are now described that achieve increased gas residence times by configuring and sizing conduit structures to have gas flow paths that have cross-sections that are increased beyond those reasonably necessary for the intended gas flow velocities (in view of known principles of gas flow in conduits) and that have lengths that are at least as long as are reasonably necessary in the circumstances (in particular, in view of the physical layout of the chamber and associated equipment). Accordingly, the injectors of this embodiment can be useful for gases that enter into the CVD chamber at higher or lower flow rates.

Since thermalizing gas injectors of this embodiment are useful for injecting thermalized gases at relatively higher flow rates, when used in connection with the growth of Group III-nitride compounds, the injectors of this embodiment are more preferred for use with N precursors, which typically enter at relatively higher flow rates, than for use with Group III-metal precursors, which typically enter at relatively lower flow rates. However, the injectors of this embodiment can also be useful for gases that enter into the CVD chamber at relatively higher flow rates.

Figure 3B:
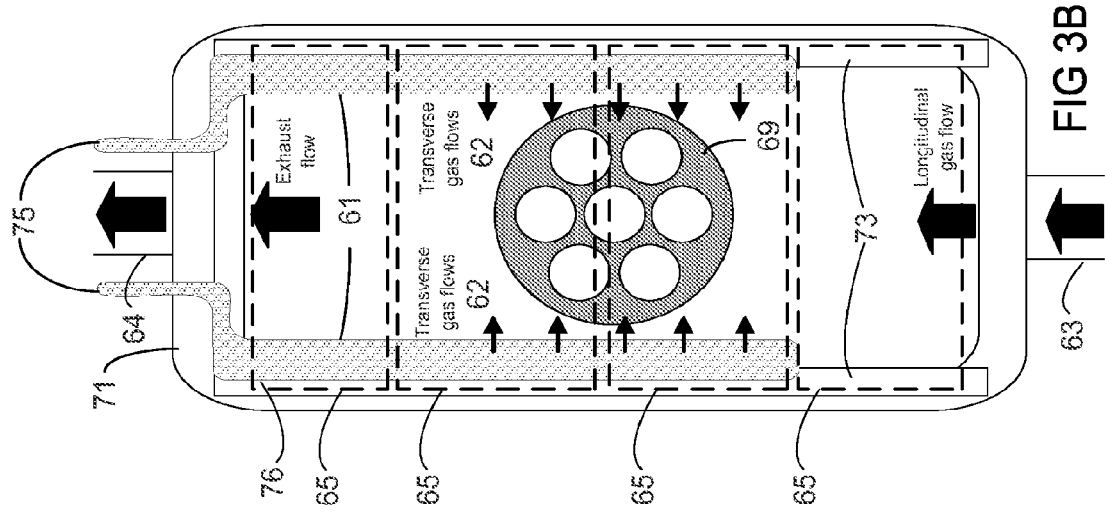
FIGS. 3A-3C schematically illustrate a second embodiment of the thermalizing gas injectors of this invention.
Figure 3A:
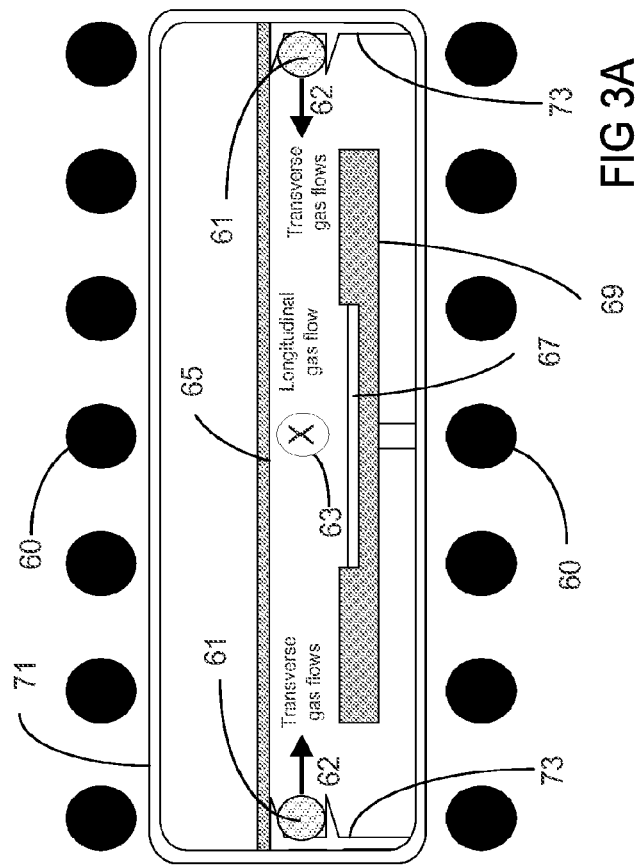

FIGS. 3A and 3B illustrate cross-sectional and transverse views, respectively, of an embodiment of the preferred thermalizing gas injectors. Conventional components include chamber housing 71, susceptor 69, growth substrate 67, and heating elements 60. Conduit structures 61 in this embodiment are arranged along both side sides of chamber housing 71 at the level of the upper surface of susceptor 69. Gas enters inlet ports 75, flows within the conduit structure in a longitudinal direction along the side walls, and exits through one or more outlet ports that direct gas in transverse flows 62 across the upper surface of susceptor 69 toward growth substrate 67. The conduit structures of this embodiment can also include other elements, in particular, outer housings. Conduit structures 61 are supported and held in the chamber by fixtures as known in the art, here, by exemplary left and right support fixtures 73 having transversely projecting prongs (or shelves) on which the gas-conducting conduits are supported. A single, longer support fixture can extend each side wall of the CVD chamber, or alternately, multiple, shorter support fixtures can be positioned along each wall.

Conduit structures 61 can be actively heated, or passively heated, or both passively and actively heated. As with conduit structures 47 (of FIG. 2C), conduit structures 61 can also be actively heated by providing heat-producing elements that are adjacent to at least a part of the gas-conducting portion. Preferably, conduit structures 61 are passively heated by being partially or entirely routed through and/or located within a heated environment, e.g., a heated CVD chamber. Also, passive heat transfer means are preferably associated with a portion (or all) of the conduit structure within the heated embodiment in order to improve heat transfer from the environment to the conduit structures. For example, such passive heat transfer means can comprise a black body material so as to absorb radiation from chamber heat lamps and re-radiate the absorbed heat to the conduit structure.

FIG. 3A illustrates passive heat transfer means that include one or more plates 65 that are supported above the conduit structures on the upper prongs of exemplary fixtures 73 and that extend across the CVD chamber (thus, also improving heat transfer to the susceptor). FIG. 3B illustrates multiple plates 65 positioned along the chamber so as to cover a substantial fraction of both gas conduits 61. Note that the gaps illustrated between plates 65 are for clarity only as normally these plates would be adjacent to each other. Alternatively, gas-conducting conduits 61 can be placed below plates 65, or plates 65 can extend only over conduits 61 leaving the center portion of the chamber exposed to the heat lamps.

Figure 3C:
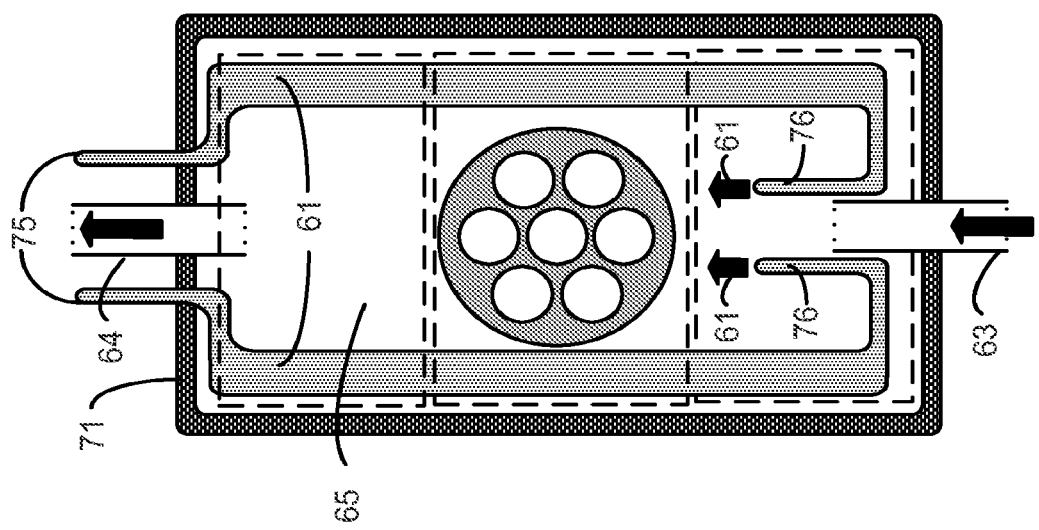

Embodiments of the thermalizing gas injectors of this embodiment can inject gas with flow patterns different from the transverse flow patterns illustrated in FIGS. 3A and 3B. For example, FIG. 3C illustrates an embodiment in which gas-conducting conduits 61 are further configured to have outlet ports 76 that inject gases in longitudinal directions parallel to gas flows 63. Gas-conducting conduits 61 of FIG. 3C can be provided with further outlet ports, as in FIGS. 3A and 3B, for injecting gases in transverse flows. Gases can be injected in further flow patterns by providing appropriate outlet ports as will be apparent to one of ordinary skill in the art. Further embodiments can have only a single (left or right) gas-conducting conduit 61, can inject different second gases through each of the two illustrated gas-conducting conduits, and so forth.

Gas-conducting conduits of this embodiment are preferably fabricated from non-metallic materials that are capable of withstanding the high temperature, corrosive environments that develop in the interior of operating CVD reactors, e.g., HVPE reactors, and that have little or no interaction with precursor gases (especially $NH_3$). Such a preferred material comprises quartz. The black body plates preferably comprise materials with high emissivity values (close to unity) that are also capable of withstanding the high temperature and corrosive environments. Preferred such materials include AlN, SiC and $B_4C$ (emissivity of 0.98, 0.92, and 0.92, respectively).

Further, the conduit structures and passive heat-transfer means are preferably sized and configured in view of a particular CVD chamber so that they can be arranged within that chamber so as not to interfere with the operation of, e.g., existing gas injectors, the susceptor, robot transfer means, and other associated components. Accordingly, different specific embodiments of the thermalizing gas injectors can be sized and configured to be arranged within differently sized and configured CVD chambers. For example, the thermalizing gas injectors illustrated in FIGS. 3A-3C have been sized and configured to be arranged in and cooperate with exemplary CVD reactor 1 of FIG. 1 in the manner now described.

First gases are injected in longitudinal flow gas 63 from injectors located at the upstream end (bottom in FIGS. 3B and 3C) of CVD chamber housing 71 and flow toward the susceptor. Although not specifically illustrated, the upstream injectors can be one or more of the injectors of the embodiments of FIGS. 2A-2D. Second gases enter thermalizing gas injectors 61 of this embodiment through inlet ports 75 (external to the chamber housing 71), and flow within larger cross-sectional gas-conducting conduits 61. In the case of FIG. 3B, gases are injected through a plurality of outlet ports in a plurality of transverse streams flowing from both sidewalls toward the susceptor; and in the case of FIG. 3C, second gases are injected in two longitudinal streams flowing toward the susceptor. First and second gases meet and react over the susceptor, and spent gases exit through exhaust 64. Gas-conducting conduits 61 have been sized and configured to be arranged largely against the walls of chamber housing 71 so as not to interfere with the susceptor and other components.

Also, in the case of FIG. 3B, specifics of the pattern of transverse flows 62 can be readily controlled by, e.g., differences in the sizes of the outlet ports. The larger cross-sections of diameters of gas-conducting conduits 61, although selected primarily to increase the residence time available for absorbing heat from the chamber interior, also permit the gas-conducting conduits to act as plenum chambers that approximately equalize gas pressures along the length of the conduits. For example, if the outlet ports are of similar sizes, transverse flows 62 can be longitudinally uniform, while if the outlet ports are of varying sizes, the transverse flows can be varying.

As described, thermalizing gas injectors of this embodiment, in particular, injectors configured similarly to injector 61 of FIGS. 3A-3C, can be used to provide gaseous N precursors into a CVD chamber for the processing of Group III-nitride compounds, in particular, for providing $NH_3$ for GaN growth according to an HVPE process. For such applications, gas-conducting conduits 61 can be sized from about 1 cm to 2 cm to 2.5 cm (and sizes therebetween), preferably comprise quartz, are supported within the chamber below (alternately, above) black body plates by fixtures 73, and have gas outlet flows 62 in the vicinity of the upper surface of the susceptor 69. The injectors preferably comprise quartz; and passive heating plates preferably comprise SiC, $B_4C$, AlN.

In operation, $NH_3$ enters the injector through inlet ports 75 at flow rates of 1-3 SLM. Only one or no more than two such inlets could be utilized. The outlets of gas-conducting conduits 61 are located in the vicinity of susceptor 69. The $NH_3$ is heated by heat transferred from the heated interior of the CVD chamber and from SiC plates, both of which are heated by external lamp sources 60 situated above (and below) the quartz reactor housing 71. The $NH_3$ is preferably heated to a temperature of at least 600° C. prior to entry in the reaction chamber.

Further Preferred Embodiments of Thermalizing Gas Injectors

Preferred embodiments of the thermalizing gas injectors of this invention are now described that, as well as achieving some degree of thermalization due to increased gas residence times, inject one or more gas streams in separate longitudinal gas flows with controlled transverse spatial distribution. In particular, the spatial distribution of at least one longitudinal gas stream is controlled to be transversely largely uniform across a width that is a significant portion of the diameter of the susceptor. Spatial distributions can also be controlled so that different gases do not prematurely mix, or change temperatures, or chemically interact. Injectors of this embodiment are referred to herein as "visor"-type injectors, or as "visor" injectors, or as "visors."

For example, in the case of growth of Group III-nitride compounds, visor injectors of this embodiment are useful for injecting Group III-precursor gases, N precursor gases, and purge gases. In particular, a visor injector can inject precursor gases in a flow that is largely uniform in a transverse direction across a width that is a significant portion of the diameter of the susceptor. Thus, as the susceptor rotates, the growth substrates will have a largely uniform exposure to one of the precursors.

The term "significant portion of the susceptor," when used herein in the above context, means that the gas flow (as injected and without significant spreading) can sufficiently reach all portions of the susceptor so that all growth substrates carried thereon can be directly exposed to the gas flow. Since a susceptor usually rotates in operation, a longitudinal flow that extends across at least about one-half or more of the diameter of the susceptor will be largely uniform across a "significant portion of the susceptor." More preferably, the flow extends across at least 65%, or 80%, or more of the diameter of the susceptor. Even more preferably, where chamber configuration permits, the flow extends substantially over all the susceptor diameter. The term "largely uniform" means that gas velocities with the flow vary by less than about 15%, or less than about 25%, or less than about 35%.

Visor-type injectors have outlet ports with cross-sections chosen to foil and encourage the exiting gas into the selected longitudinal distributions. In particular, a visor-type injector has at least one outlet port with a transverse width that is a significant portion of the susceptor, e.g., a transverse width that is about one-half or more of the susceptor diameter (a "wide" outlet port). Other outlet ports ("narrow" outlet ports) are typically narrower in order to inject gases in more restricted flows (e.g., such as flows that would be injected through outlet ports configured similarly to outlet ports 76 of FIG. 3C). Conveniently and preferably, the vertical extents of wide outlet ports are less than (or much less than) that of their transverse extents so that these outlets can be considered to have an, e.g., "flattened" shape. Narrow outlet ports can have comparable transverse horizontal and vertical extents.

Outlet ports with larger transverse extent and smaller vertical extent can be conveniently accommodated by fabricating visor-type injectors from planar materials to have a planar shape. Outlet ports are preferably along a transverse edge of the planar shape; inlet ports can preferably be in the body or along an opposite transverse edge; and channels within the planar shape link inlet and outlet ports. Ports and channels (or grooves or cut-outs) can readily be fabricated in a first planar material by, e.g., etching, or machining, or ablating, or the like, and then by sealing the open channels with a second planar material. In other embodiments, channels can be formed in both the first and second planar materials, or within a single piece of a planar material. The planar materials preferably are able to withstand high temperature and chemically corrosive environments. Such a preferred material is quartz; also black body materials such as AlN, SiC and $B_4C$ can also be used.

Preferably, the channel linking the wide outlet port with its (one or more) inlet port has an increasing transverse extent, relatively narrow in the vicinity of the inlet port and increasing gradually until it matches the transverse extent of its outlet port. In various embodiments, such increasing channels can have different shapes with differently configured side walls. For example, such a channel with linear side walls can have a "wedge-like" shape. Alternatively, with curvilinear side walls, such a channel can have a "bell-like" (convex side walls) or "nozzle-like" shape (concave side walls). Generally, the channel shape and wall configuration can be selected according to the principles of fluid flow so that the flow injected through the outlet ports has desired characteristics, e.g., transverse uniformity. Channels linking narrow outlet ports to their inlet ports can have a largely constant cross-sectional size.

Figure 4A:
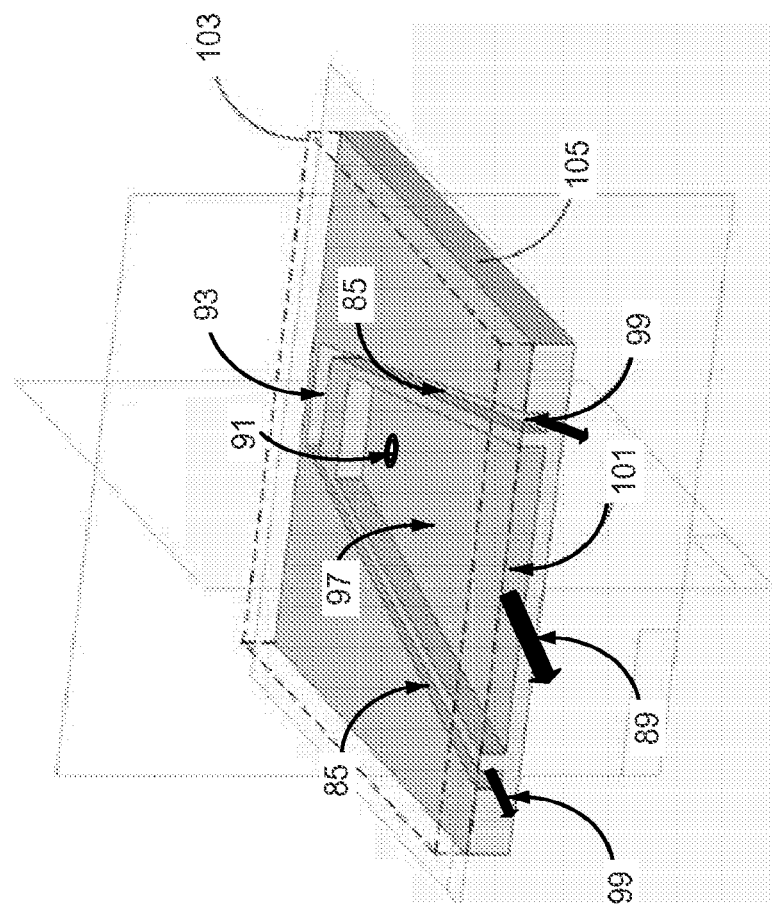
FIGS. 4A-4C schematically illustrate a third embodiment of the thermalizing gas injectors of this invention.
Figure 4B:
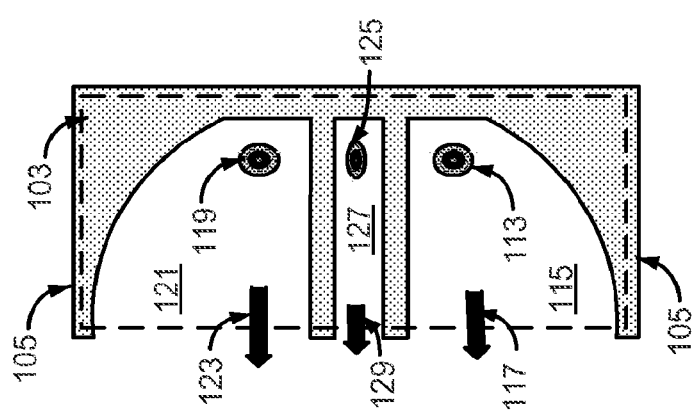
Figure 4C:
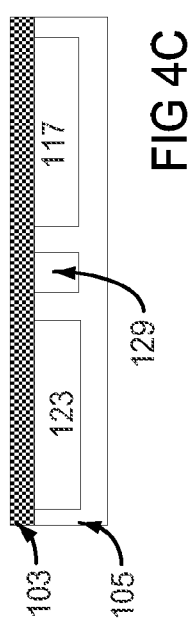

FIGS. 4A-4C illustrate exemplary embodiments of visor-type injectors with exemplary configurations and arrangement of wide and narrow channels. FIG. 4A illustrates a visor injector with single-wide, centrally located outlet port 89 and two narrow outlet ports 99 located laterally to outlet port 89. The solid arrows indicate gas flows that could be injected through these ports. Gas-conducting conduit 97 links inlet port 91 to outlet port 89 and has a generally wedge-like shape, extending from a narrower apex portion near the gas inlet port 91 and linearly widening until it has a transverse extent equal to that of outlet port 89. Gas-conducting conduit 85 links inlet port 93 (not visible in this figure) to both outlet ports 99. This conduit is configured to have two arms ending in the outlet ports and a central portion linking the arms with the inlet port and sized to have a largely constant and relatively narrow cross-sectional size. This conduit lies outside of (and does not intersect with) conduit 97. In this visor-type injector, the ports and channels are in bottom planar material 105 and are sealed by top planar material 103, both of which preferably comprise quartz.

FIG. 4B illustrates another exemplary visor-type injector with two relatively wide and laterally located outlet ports 117 and 123 and a single, relatively narrow and centrally located outlet port. Gas-conducting conduit 115 links inlet port 113 to outlet port 117 and has a shape with one straight side wall and one curvilinear side wall so that its transverse extent, which increases more rapidly in the vicinity of inlet port 113 and more slowly in the vicinity of outlet port 117. Gas-conducting conduit 121, which links inlet port 119 to outlet port 123 has a similar, but mirror-image shape. Visualized together, both these conduits have a form that can be considered "nozzle-like." Gas-conducting conduit 127 links inlet port 125 with narrower outlet port 129 and has a largely constant cross-sectional size.

FIG. 4C illustrates an end view of the embodiment of FIG. 4B, and demonstrates that a visor-type injector can be fabricated from heterogeneous materials. Here, in contrast to the embodiment of FIG. 2A, bottom planar material preferably comprises quartz, and top planar material preferably comprises a black body material.

Gases injected by visor injectors are preferably thermalized. In some embodiments, a visor-type injector can receive gases that have already been thermalized by prior passage through accessory injectors, e.g., injectors similar to the embodiments of FIGS. 2A-2D or FIGS. 3A-3C. In preferred embodiments, visor injectors are heated so as to thermalize, or to further thermalize, injected gases. Active heating using extra heating elements is less preferred (due to an injector's large transverse extent).

More preferably, visor injectors can be passively heated by being placed within a CVD chamber. Also, the residence times of gases injected through wide outlet ports can be increased due to decreased average flow velocities. In particular, as gases flow from a narrower part of a channel toward a wider part of the channel, their flow velocities decrease in comparison to gases injected through a channel of the same length but constant cross-sectional size. Further, passive black body elements can be provided to increase heat transfer to a visor-type injector. Such black body elements can be part of the injector as illustrated in FIG. 4C. Also, similar to other injectors of this invention, black body plates can be provided exterior but adjacent to a visor-type injector.

Figure 5:
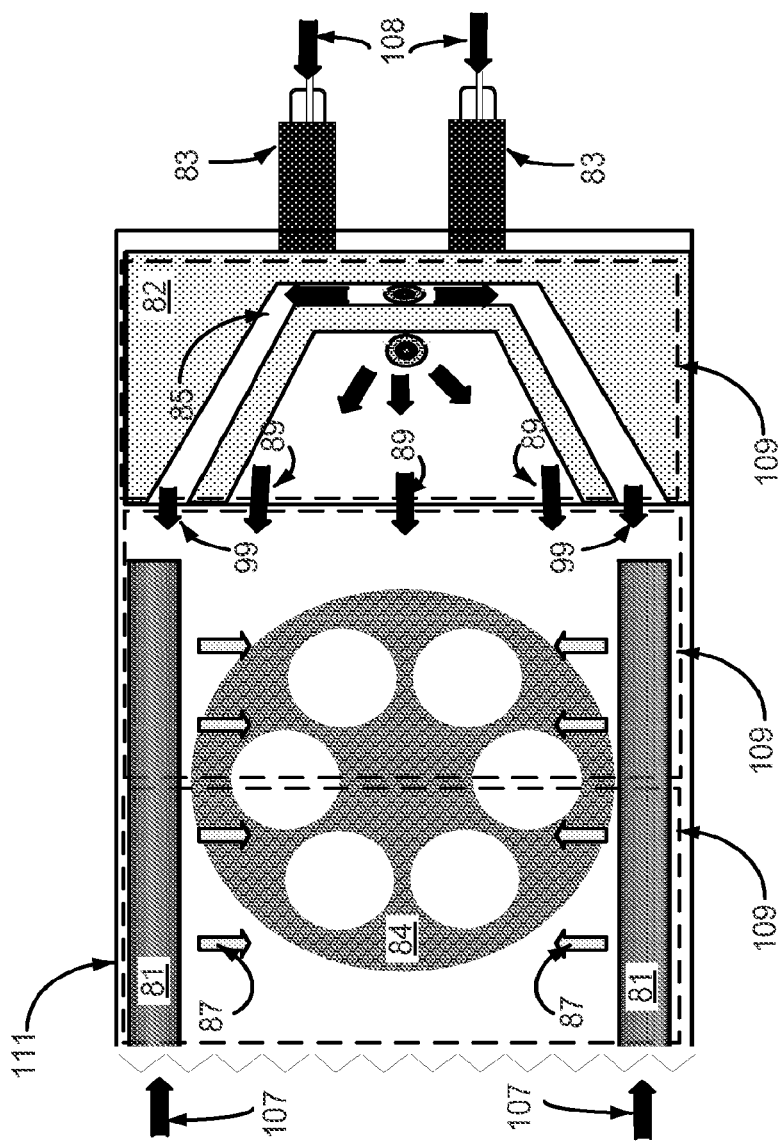
FIG. 5 schematically illustrates a combination including the exemplary CVD chamber and the thermalizing gas injectors of this invention.

FIG. 5 illustrates a combination of an exemplary CVD chamber 111 with several of the thermalizing gas injectors of this invention, especially with visor-type injectors, cooperating to inject thermalized gases necessary for a certain CVD process. Here, visor-type injector 82, similar to the embodiment illustrated in FIG. 4A, is positioned in the upstream end of chamber 111, and injects first and second gas flows: first gas flow through outlet port 89 is largely uniform in a transverse direction across a width that is a significant portion of the diameter of susceptor 84; and second gas flows through outlet ports 99 are lateral to the sides of first gas flow through outlet port 89 and of limited transverse extent.

Both the first and second gas flows are thermalized. Visor-type injector 82 receives gas flows 108 from external sources that have already been thermalized by passage through injectors 83 that are similar to the injector described with reference to FIGS. 2C and 2D. Injectors 83 are actively heated and are located largely external to chamber 111. Visor-type injector 82 is located within chamber 111 so it can further thermalize gases before injection. Optional black body plates 109 (indicated for clarity in dashed outline) are provided adjacent to injector 81 to improve heat transfer from the chamber to the visor-type injector.

The combination also includes injectors 81, similar to the injectors described with reference to FIGS. 3A and 3B, that are positioned lateral to susceptor 84 and adjacent to the side walls of chamber 111, and inject third gas flows 87 in a transverse direction from both chamber walls to and across susceptor 84. Transverse flows can have selected longitudinal distributions depending on the sizes of structures of the outlet ports from injectors 81. For example, the outlet ports can be configured and sized so that transverse flows 87 are also substantially uniform across a significant portion of the susceptor.

Injectors 81 are located within chamber 111 so gases can be thermalized before injection. Optional black body plates 109 are provided adjacent to injectors 81 to improve heat transfer from the chamber to the visor-type injector.

This combination of CVD chamber and the thermalizing gas injectors of this invention can be useful for, e.g., deposition of Group III-nitride materials, especially GaN according to an HVPE process. For GaN deposition, gas flows through outlet port 89 could comprise gaseous $GaCl_3$, gas flows 87 could comprise $NH_3$, and gas flow through outlet ports 99 could comprise a purge gas such as $H_2$. Both precursor gases are injected from perpendicular directions in flows that are largely uniform in a transverse direction across a width that is a significant portion of the diameter of susceptor 84, and a purge gas can be injected for various purposes.

Different combinations of the injectors of this invention can be arranged to inject gas flows in the other selected patterns. In addition, the injectors and related gas introduction features of U.S. patent application Ser. No. 13/680,241 are expressly incorporated herein.

Although specific features of the invention are shown in some drawings and not in others, this is for convenience only as each feature may be combined with any or all of the other features in accordance with the invention. The words "including," "comprising," "having," and "with" as used herein are to be interpreted broadly and comprehensively and are not limited to any physical interconnection. The articles "a" or "an" or the like are also to be interpreted broadly and comprehensively as referring to both the singular and the plural. Moreover, any embodiments disclosed in the subject application are not to be taken as the only possible embodiments. Other embodiments will occur to those skilled in the art and are within the following claims.

What is claimed is:

1. An apparatus for epitaxial deposition of a monocrystalline Group III-V semiconductor material, comprising:
    a source of gallium trichloride as a Group III component reactant;
    a source of a Group V component reactant;
    a reaction chamber that receives gas streams of the Group III component reactant and the Group V component reactant;
    one or more substrates positioned in the reaction chamber to receive a deposit of semiconductor material from reaction of the Group III component reactant and the Group V component reactant;
    a heating chamber external of the reaction chamber for heating the Group III component reactant to a temperature sufficient to decompose dimers therein as well as to prevent dimer formation of the Group III component reactant prior to contacting the one or more substrates; and
    a first gas injector operatively associated with the heating chamber and the reaction chamber, the first gas injector comprising:
        a bottom planar material having a funnel- or wedge-shaped channel in an upper surface thereof, the funnel- or wedge-shaped channel defining a first gas-conducting conduit in the first gas injector having a cross-sectional width that increases in a direction of gas flow through the funnel- or wedge-shaped channel in order to provide an expanded laminar stream of the Group III component reactant, the expanded laminar stream being sufficiently expanded to flow above each of the one or more substrates upon exiting the funnel- or wedge-shaped channel to thereby deposit the monocrystalline Group III-V semiconductor material on the one or more substrates, the bottom planar material further having another channel formed in an upper surface thereof, the another channel defining a second gas-conducting conduit in the first gas injector having two arms extending respectively to two outlet ports located respectively on opposing lateral sides of the funnel- or wedge-shaped channel; and
        a top planar material disposed over the bottom planar material such that the first gas-conducting conduit and the second gas conducting conduit are sealed within the first gas injector between the bottom planar material and the top planar material.

2. The apparatus of claim 1, further comprising a second gas injector for heating and passing a laminar stream of the Group V component into the reaction chamber in a flow path transverse to and above the expanded laminar stream of the Group III component reactant and at a velocity such that the Group V component reactant and the Group III component reactant react above the one or more substrates and deposit the semiconductor material thereon.

3. The apparatus of claim 1, wherein the heating chamber comprises heat-producing elements located external to the heating chamber and a silicon carbide material internal to the heating chamber, and wherein the heating chamber comprises a spiral tube that surrounds silicon carbide material.

4. The apparatus of claim 1, wherein the first gas injector is located adjacent a wall of the reaction chamber upstream of the substrates.

5. The apparatus of claim 1, wherein the heating chamber is configured for expanding the Group III component reactant to provide a longer gas flow path and an increased gas flow time path that allows the Group III component reactant to contact the silicon carbide material directly or indirectly to heat the Group III component reactant to a temperature of at least 700° C. to 800° C.

6. The apparatus of claim 1, wherein the heating chamber is configured to direct the Group III component reactant in a first direction through a slot opening and the reaction chamber includes a wall member along the slot that changes the direction of flow of the Group III component reactant to a second direction along the reaction chamber wall and toward the one or more substrates.

7. The apparatus of claim 1, wherein the reaction chamber includes a susceptor for supporting the substrates, the susceptor configured to rotate the substrates while the gallium trichloride and the Group V component reactant flow toward the susceptor.

8. The apparatus of claim 1, further comprising:
    an enclosure surrounding the reaction chamber for controlling temperature thereof; and
    one or more fans for passing cooling gas through the enclosure, the cooling gas flowing through the enclosure in the same direction as the gallium trichloride and the Group V component reactant so as to remove heat and prevent deposition of semiconductor material on walls of the reaction chamber.

9. The apparatus of claim 8, further comprising heating sources for heating the reactor located in the enclosure.

\* \* \* \* \*